United States Patent
Gang et al.

(10) Patent No.: US 11,327,403 B2
(45) Date of Patent: May 10, 2022

(54) ILLUMINATION OPTICAL SYSTEM FOR PROJECTION LITHOGRAPHY

(71) Applicant: Carl Zeiss SMT GmbH, Oberkochen (DE)

(72) Inventors: Tian Gang, Veldhoven (NL); Jan Van Schoot, Veldhoven (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/317,112

(22) Filed: May 11, 2021

(65) Prior Publication Data
US 2021/0263421 A1 Aug. 26, 2021

Related U.S. Application Data

(63) Continuation of application No. PCT/EP2019/080203, filed on Nov. 5, 2019.

(30) Foreign Application Priority Data

Nov. 29, 2018 (DE) .......................... 102018220625.2

(51) Int. Cl.
- *G03F 7/20* (2006.01)
- *G02B 5/08* (2006.01)
- *G02B 5/09* (2006.01)

(52) U.S. Cl.
CPC ....... *G03F 7/70075* (2013.01); *G02B 5/0891* (2013.01); *G02B 5/09* (2013.01); *G03F 7/7015* (2013.01); *G03F 7/70958* (2013.01)

(58) Field of Classification Search
CPC .............. G03F 7/70075; G03F 7/7015; G03F 7/70958; G03F 7/70091; G03F 7/70316;
(Continued)

(56) References Cited

U.S. PATENT DOCUMENTS

| 8,174,677 | B2 | 5/2012 | Ossmann et al. |
| 8,587,767 | B2 | 11/2013 | Fiolka et al. |

(Continued)

FOREIGN PATENT DOCUMENTS

| DE | 10 2005 048 652 A1 | 4/2006 |
| DE | 10 2008 041 593 A1 | 4/2009 |

(Continued)

OTHER PUBLICATIONS

German examination report, with translation thereof, for corresponding DE Appl 10 2018 220 625.2, dated Jul. 1, 2019.
(Continued)

*Primary Examiner* — Mesfin T Asfaw
(74) *Attorney, Agent, or Firm* — Fish & Richardson P.C.

(57) ABSTRACT

An illumination optical system for projection lithography includes a pupil facet mirror having pupil facets. For at least some of the pupil facets which are designed as selectively reflecting pupil facets, the selectively reflecting pupil facet has a reflective coating for the illumination light, wherein a first coating area on a first part of the selectively reflecting pupil facet has a first reflectivity, a second coating area on a second part of the selectively reflecting pupil facet has a second reflectivity, the first coating area is different from the second coating area, and the first reflectivity is different from the second reflectivity. In combination or as an alternative, for at least some of the pupil facets which are designed as broadbands reflecting pupil facets, the broadband reflecting facets have a broadband reflective coating for the illumination light.

20 Claims, 6 Drawing Sheets

(58) Field of Classification Search
CPC ......... G03F 7/702; G02B 5/0891; G02B 5/09; G02B 5/0816; G21K 1/062; G21K 2201/067; B82Y 10/00
See application file for complete search history.

(56) References Cited

U.S. PATENT DOCUMENTS

| | | |
|---|---|---|
| 9,841,683 B2 | 12/2017 | Patra |
| 10,146,136 B2 | 12/2018 | Endres et al. |
| 10,203,435 B2 | 2/2019 | Schicketanz et al. |
| 2016/0195648 A1* | 7/2016 | Schicketanz ........... B82Y 10/00 355/71 |
| 2018/0341179 A1 | 11/2018 | Enkisch |

FOREIGN PATENT DOCUMENTS

| | | |
|---|---|---|
| DE | 10 2008 001 511 A1 | 11/2009 |
| DE | 10 2009 017 069 A1 | 10/2010 |
| DE | 10 2013 203 364 A1 | 9/2014 |
| DE | 10 2013 218 130 A1 | 3/2015 |
| DE | 10 2014 200 932 A1 | 7/2015 |
| DE | 10 2016 201 564 A1 | 8/2017 |

OTHER PUBLICATIONS

Translation of International search report for corresponding Appl No. PCT/EP2019/080203, dated Jun. 3, 2020.

* cited by examiner

ILLUMINATION OPTICAL SYSTEM FOR PROJECTION LITHOGRAPHY

CROSS-REFERENCE TO RELATED APPLICATIONS

The present application is a continuation of, and claims benefit under 35 USC 120 to, international application PCT/EP2019/080203, filed Nov. 5, 2019, which claims benefit under 35 USC 119 of German Application No. 10 2018 220 625.2, filed Nov. 29, 2018. The entire disclosures of these applications are incorporated by reference herein.

FIELD

The disclosure relates to an illumination optical system for projection lithography for illuminating an illumination field, in which an object field of a following imaging optical system can be arranged. Further, the disclosure relates to an illumination system with an illumination optical system of this type, a projection exposure system with an illumination system of this type, a production method for microstructured or nanostructured components using a projection exposure system of this type and a microstructured or nanostructured component produced by a production method of this type.

BACKGROUND

Illumination optical systems for projection lithography are known from U.S. Pat. No. 6,658,084 B2 and U.S. Pat. No. 7,196,841 B2. Further, such illumination optical systems are known from U.S. Pat. No. 8,817,233 B2, from U.S. Pat. No. 9,939,731 B2, from DE 10 2008 001 511 A1, from DE 10 2016 201 564 A1, from DE 10 2013 218 130 A1 and from DE 10 2009 017 069 A1.

SUMMARY

The present disclosure seeks to provide an illumination optical system such a way that a desired combination of high illumination light throughput on the one hand and uniform illumination of the illumination field is achieved.

In an aspect, the disclosure provides an illumination optical system for projection lithography for the illumination of an illumination field, in which an object field of a following imaging optical system can be arranged. The illumination optical system includes a pupil facet mirror having a plurality of pupil facets, wherein each pupil facet is designed for guiding an illumination light part bundle. For at least some of the pupil facets which are designed as selectively reflecting facets the following holds: the selectively reflecting pupil facet has a reflective coating for the illumination light, wherein a first coating area on a first part of the selectively reflecting pupil facet has a first reflectivity, a second coating area on a second part of the selectively reflecting pupil facet has a second reflectivity, the first coating area is different from the second coating area, and the first reflectivity is different from the second reflectivity. And/or, for at least some of the pupil facets which are designed as broadband reflecting pupil facets the following holds: the broadband pupil facets have a broadband reflective coating for the illumination light.

By use of selectively reflecting pupil facets having different coating areas with different reflectivities, it can be possible to achieve a correction of an illumination intensity gradient of the illumination light intensity distribution over the illumination field. The reflective coating on the respective selectively reflecting pupil facets has a reflectivity distribution which can enable such correction. A fine compensation of an intensity gradient over the illumination field which, without such a correction mechanism, would be present can be possible at least when applying certain desirable illumination settings. Each illumination light channel including one of such selectively reflecting pupil facets may be corrected independently of the other illumination channels. When using at least one broadband reflecting pupil facet alternatively or in addition to the selectively reflecting pupil facets, an otherwise present illumination intensity gradient over the optical field can be smoothed out by applying the broadband coating. Such broadband coating can reduce an angle dependency of the pupil facet reflectivity and results in a reduction in the illumination intensity gradient.

Using such selectively reflecting/broadband reflecting pupil facets can add a new degree of freedom to optimize the illumination conditions achieved by the illumination optical system. Such an illumination optical system may be used in combination with an imaging optical system with large image side numerical aperture which, for example, may be higher than 0.3 (e.g., higher than 0.4, higher than 0.5, higher than 0.6, higher than 0.7 or even higher).

The illumination light may have a wavelength in the EUV range (between e.g. 5 nm and 30 nm) or in the DUV range (e.g. at 193 nm).

A subgroup of all pupil facets, i.e. not all pupil facets, may be designed as selectively reflecting facets. A subgroup of the pupil facets, i.e. not all pupil facets, may be designed as broadband reflecting facets. In case the pupil facet mirror includes both selectively reflecting facets and broadband reflecting facets, such selectively and/or broadband reflecting facets may be present on different subgroups.

In some embodiments, a third coating area on a third part of the selectively reflecting pupil facet has a further reflectivity, wherein the third coating area is different from the first and second coating areas, and the further reflectivity is different from the second reflectivity. Such embodiments can provide additional degrees of freedom. The further reflectivity of the third coating area may be the same reflectivity as a non-adjacent other area, e.g. the same as the first coating area. In further embodiments, a larger number of coating areas with specific reflectivities may present on the selectively reflecting pupil facet.

In some embodiments, the reflectivities of two adjacent of the different coating areas merge continuously into each other. Such embodiments can allow a fine adaption of the reflectivity on the overall selectively reflecting pupil facet.

In some embodiments, the pupil facets of the pupil facet mirror are arranged so that an image of the light source arises at an image location which lies at a distance from the pupil facet along the illumination channel. In such embodiments, can enhance the possibilities of a field dependent reflectivity correction. Depending on the distance of the pupil facet to the image of the light source, an illumination light part bundle impinging on the respective pupil facet can have an edged contour which can be explained by a convolution of the illumination light source contour and a field-related structure, e.g. the edge contour of a field facet. Fitting a reflectivity distribution over the selectively reflecting pupil facets, for example by choosing the size, the orientation and the structure of the different coating areas of the reflective coating, to the size and orientation of the respective edge contour of the illumination light part bundle impinging on that pupil facet can enable fine adjustments of the illumination distribution of the illumination light part bundle which contributes to the object field illumination.

Generally, to render such a fine adjustments of the illumination distribution of the illumination light part bundle possible, the following condition is satisfied for the defocus distance a:

$$a = k\, B_{if} f_f / B_f$$

Here, k characterizes the ratio between the sizes $x_f$ and r, i.e. between a typical extent $x_f$ of a residual field component, and a radius r of sub-beams emanating from respective field points.

$B_f$ is the typical size of an image of an intermediate focus on the respective pupil facet. $f_f$ is the focal length of the associated field facet, i.e. the focal length with which the respective illumination light partial beam is imaged by the associated field facet. $B_f$ is the typical extent of the field facet.

Thus, the ratio $K = x_f / r$, i.e. the ratio of the size of the residual field component $x_f$ on the pupil facet to the typical dimension r of the sub-beams, inter alia, is decisive for the defocus distance value a. The following holds true: $2r = B_{if}$. So that the field-dependent correction is possible, the following additionally applies:

$$k \geq 0.5$$

$k \geq 1$ may apply, i.e. that residual field component $x_f$ has a typical size that is greater than the radius of the sub-beams. The field dependence of the correction described above improves with increasing k. k may be greater than 1.5, may be greater than 2, may be greater than 3, may be greater than 4, may be greater than 5 and may also be even greater.

With respect to this k condition, reference is made to U.S. Pat. No. 9,939,731 B2.

In some embodiments, the illumination optical system further has a field facet mirror, wherein field facets of the field facet mirror are superimposingly imaged under contribution of the pupil facets of the pupil facet mirror onto the illumination field. In such embodiments, the selectively reflecting pupil facets or the broadband pupil facets may be those pupil facets which contribute to specific illumination settings, e.g. to an x dipole setting where the object field having a high xy aspect ratio is illuminated from two illumination poles from −x and +x direction.

The advantages of an illumination system including an imaging optical system as described herein, a projection exposure system including such an illumination system and an illumination light source, a production method that implements a projection exposure apparatus as described herein, a resulting structured component can correspond to those which were already discussed above with reference to the illumination optical system according to the disclosure. Precisely adapted and uniform illuminations can be specified on the component structure to be produced so that, in particular, semi-conductor chips with extremely fine and, in particular, complex structures can be produced.

BRIEF DESCRIPTION OF THE FIGURES

Embodiments of the disclosure will be described in more detail below with the aid of the drawings, in which.

DESCRIPTION OF ILLUSTRATIVE EMBODIMENTS

Figure 1:
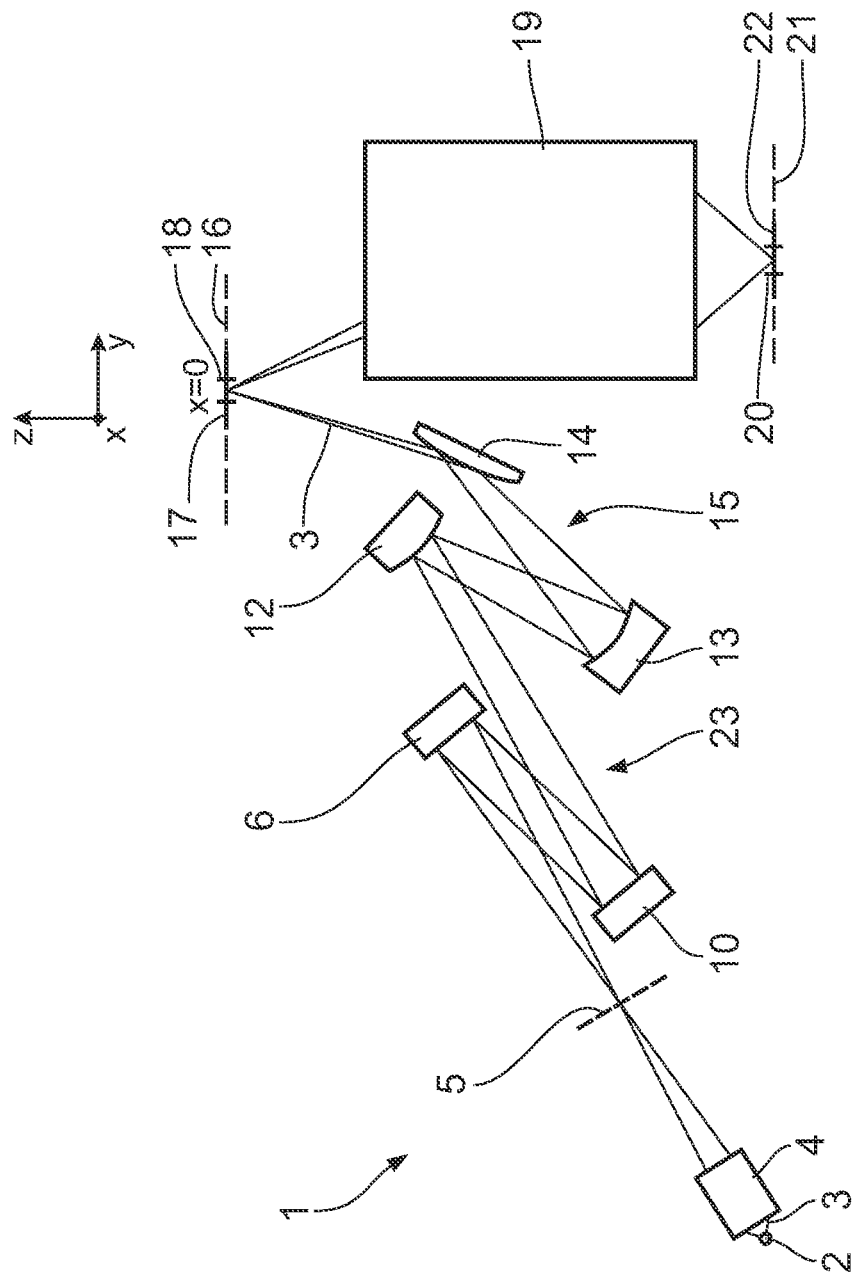
FIG. 1 shows schematically and in relation to an illumination optical system, in meridional section, a projection exposure system for microlithography.

A projection exposure system 1 for microlithography is used to produce a microstructured or nanostructured electronic semiconductor structural element. A light source 2 emits EUV radiation used for illumination in the wavelength range, for example between 5 nm and 30 nm. The light source 2 may be a GDPP source (gas discharge produced plasma) or an LPP source (laser produced plasma). A radiation source, based on a synchrotron, can also be used for the light source 2. A person skilled in the art will, for example, find information on a light source of this type in U.S. Pat. No. 6,859,515 B2. EUV illumination light or illumination radiation 3 is used for illumination and imaging within the projection exposure system 1. The EUV illumination light 3, after the light source 2, firstly runs through a collector 4, which is, for example, a nested collector with a multishell structure known from the prior art or, alternatively, an ellipsoidally formed collector. A corresponding collector is known from EP 1 225 481 A. After the collector 4, the EUV illumination light 3 firstly runs through an intermediate focus plane 5, which can be used to separate the EUV illumination light 3 from undesired radiation or particle fractions. After running through the intermediate focus plane, the EUV illumination light 3 firstly impinges on a field facet mirror 6.

To facilitate the description of positional relationships, a Cartesian global xyz-coordinates system is firstly drawn in the drawing in each case. The x-axis in FIG. 1 runs perpendicular to the drawing plane and out of it. The y-axis in FIG. 1 runs to the right. The z-axis runs upwardly in FIG. 1.

To facilitate the description of positional relationships in individual optical components of the projection exposure system 1, a Cartesian local xyz- or xy-coordinates system is also used in each case in the following FIGS. The respective local xy-coordinates, where nothing else is described, span a respective main arrangement plane of the optical component, for example a reflection plane. The x-axes of the global xyz-coordinates system and the local xyz- or xy-coordinates systems run parallel to one another. The respective y-axes of the local xyz- or xy-coordinates systems have an angle to the y-axis of the global xyz-coordinates system, which corresponds to a tilt angle of the respective optical component about the x-axis.

Figure 2:
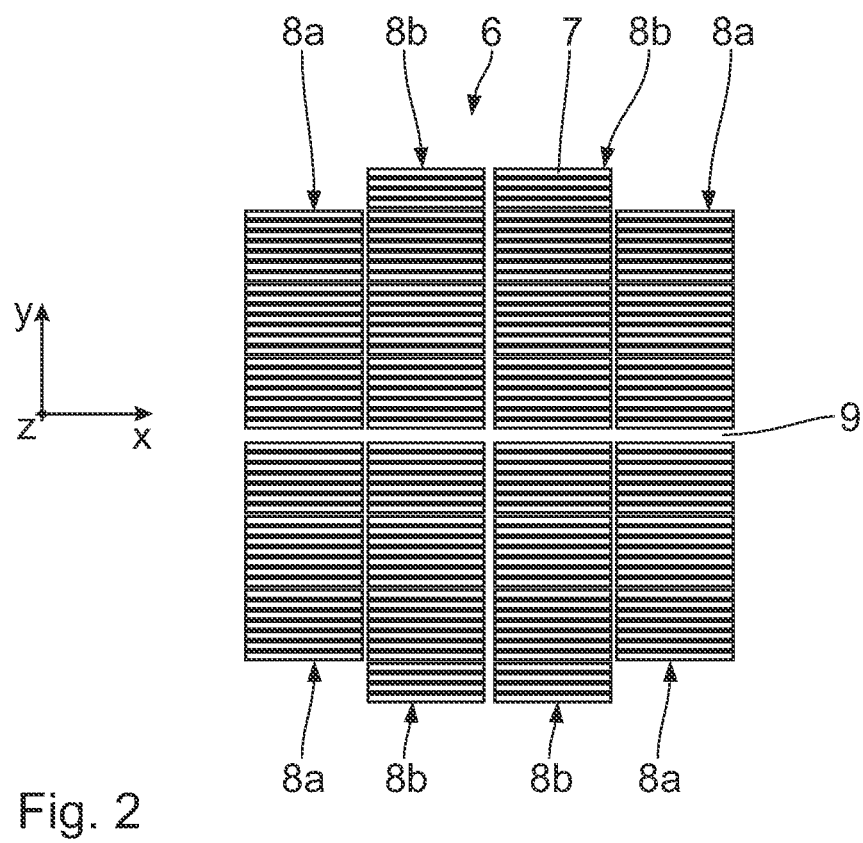
FIG. 2 shows a plan view of a facet arrangement of a field facet mirror of the illumination optical system of the projection exposure system according to FIG. 1.

FIG. 2 shows, by way of example, a facet arrangement of field facets 7 of the field facet mirror 6. The field facets 7 are rectangular and in each case have the same x/y-aspect ratio. The x/y-aspect ratio may, for example, be 12/5, 25/4 or 104/8.

The field facets 7 specify a reflection face of the field facet mirror 6 and are grouped in four columns each with six to eight field facet groups 8a, 8b. The field facet groups 8a in each case have seven field facets 7. The two additional edge-side field facet groups 8b of the two central field facet columns in each case have four field facets 7. Between the two central facet columns and between the third and fourth facet rows, the facet arrangement of the field facet mirror 6 has intermediate spaces 9, in which the field facet mirror 6 is shaded by holding spokes of the collector 4.

After reflection on the field facet mirror 6, the EUV illumination light 3 divided into beam pencils or part bundles, which are assigned to the individual field facets 7, impinges on a pupil facet mirror 10.

Figure 3:
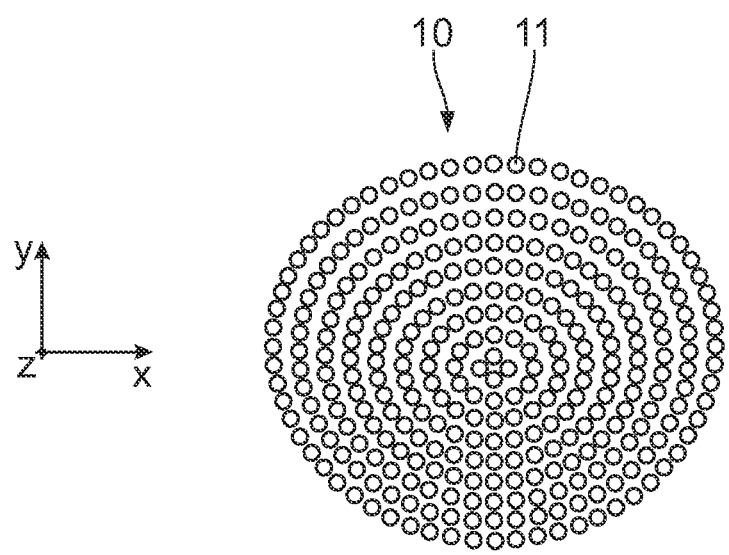
FIG. 3 shows a plan view of a facet arrangement of a pupil facet mirror of the illumination optical system of the projection exposure system according to FIG. 1.

FIG. 3 shows an exemplary facet arrangement of round pupil facets 11 of the pupil facet mirror 10. The pupil facets 11 are arranged around a centre in facet rings lying within one another. At least one pupil facet 11 is assigned to each part bundle of the EUV illumination light 3 reflected by one of the field facets 7 in such a way that, in each case, one facet pair that is impinged on with one of the field facets 7 and one of the pupil facets 11 specifies an object field illumination channel for the associated part bundle of the EUV illumination light 3. The channel-wise assignment of the pupil facets 11 to the field facets 7 takes place depending on a desired illumination by the projection exposure system 1.

The field facets 7 are imaged in an object plane 16 of the projection exposure system 1 via the pupil facet mirror 10 (cf FIG. 1) and a following transfer optical system 15 consisting of three EUV mirrors 12, 13, 14. The EUV mirror 14 is configured as a grazing incidence mirror. Arranged in the object plane 16 is a reticle 17, by which an illumination region in the form of an illumination field is illuminated with the EUV illumination light 3, the illumination field coinciding with an object field 18 of a downstream projection optical system 19 of the projection exposure system 1. Alternatively to such coincidence of the illumination field with the object field 18, the object field 18 may be arranged within a larger illumination field. The object field illumination channels are overlaid in the object field 18. In particular, the field facets 7 are superimposingly imaged under contribution of the pupil facets 11 onto the object field 18.

The EUV illumination light 3 is reflected by the reticle 17.

The projection optical system 19 images the object field 18 in the object plane 16 in an image field 20 in an image plane 21. Arranged in this image plane 21 is a wafer 22, which carries a light-sensitive layer, which is exposed during the projection exposure with the projection exposure system 1. During the projection exposure, both the reticle 17 and the wafer 22 are scanned in a synchronised manner in the y-direction. The projection exposure system 1 is configured as a scanner. The scanning direction is also called the object displacement direction below.

The field facet mirror 6, the pupil facet mirror 10 and the mirrors 10 to 14 of the transfer optical system 15 are components of an illumination optical system 23 of the projection exposure system 1. Together with the projection optical system 19, the illumination optical system 23 forms an illumination system of the projection exposure system 1.

The field facet mirror 6 is a first facet mirror of the illumination optical system 23. The field facets 7 are first facets of the illumination optical system 23.

The pupil facet mirror 10 is a second facet mirror of the illumination optical system 23. The pupil facets 11 are second facets of the illumination optical system 23.

Figure 4:
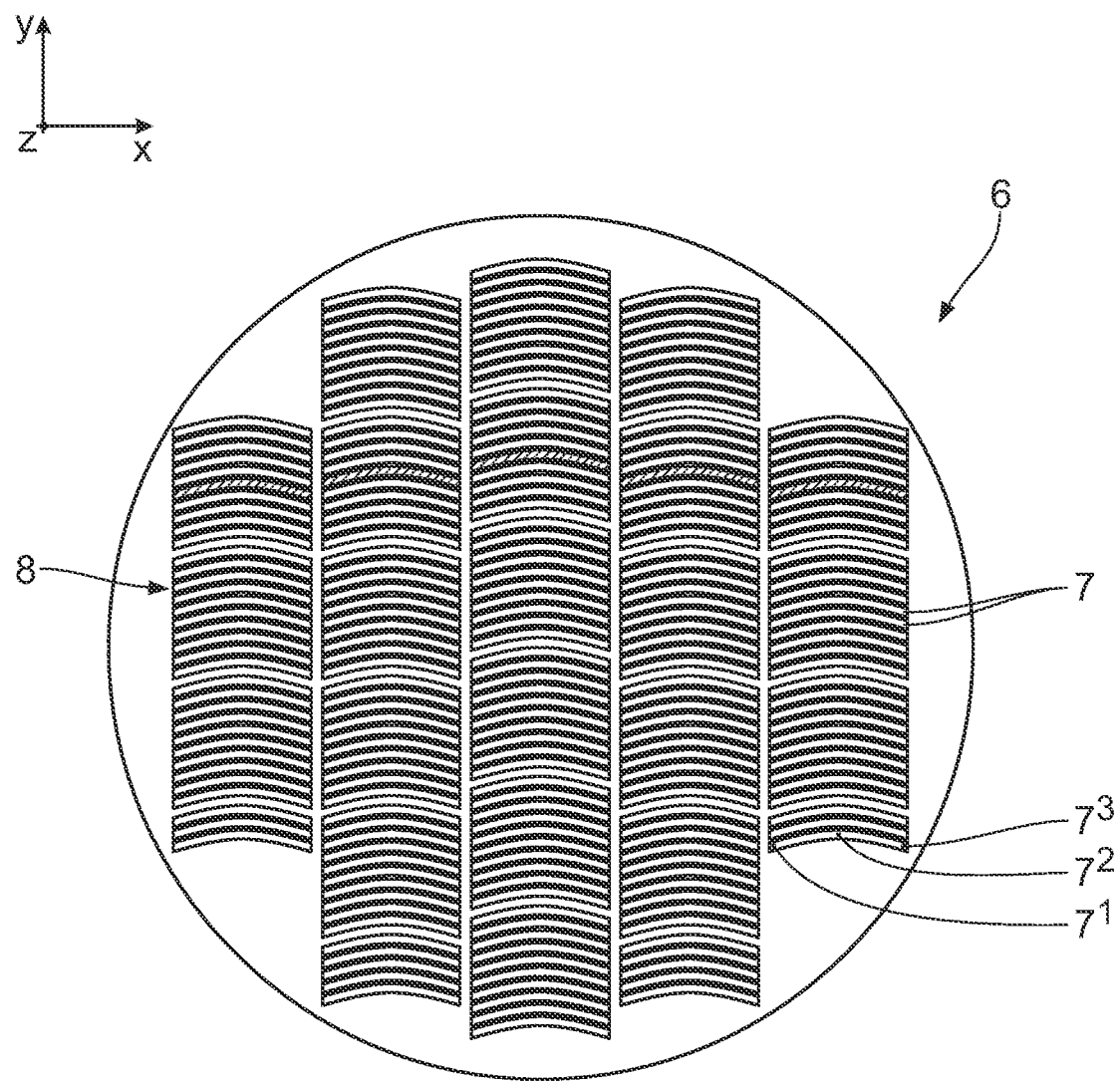
FIG. 4 shows, in a view similar to FIG. 2, a facet arrangement of a further configuration of a field facet mirror.

FIG. 4 shows a further configuration of a field facet mirror 6. Components which correspond to those which were described above with reference to the field facet mirror 6 according to FIG. 2, have the same reference numerals and will only be described in as much as they differ from the components of the field facet mirror 6 according to FIG. 2. The field facet mirror 6 according to FIG. 4 has a field facet arrangement with curved field facets 7. These field facets 7 are arranged in a total of five columns each with a plurality of field facet groups 8. The field facet arrangement is written into a circular limitation of a carrier plate of the field facet mirror.

The field facets 7 of the embodiment according to FIG. 4 all have the same area and the same ratio of width in the x-direction and height in the y-direction, which corresponds to the x/y aspect ratio of the field facets 7 of the configuration according to FIG. 2.

For example two of the pupil facets 11 of the pupil facet mirror 10 are assigned to each of the field facets 7 of the respective configuration of the field facet mirror 6 by way of an object field illumination channel, in each case. The pupil facet mirror 10 thus has twice as many pupil facets 11 as the field facet mirror 6 has field facets 7.

Depending on the configuration of a mechanical tilting ability of the field facets 7, more than two of the pupil facets 11 of the pupil facet mirror 10 may be assigned to one of the field facets 7 by way of respective object field illumination channels. The field facets 7 can then be displaced into a corresponding number of illumination tilting positions.

Figure 5:
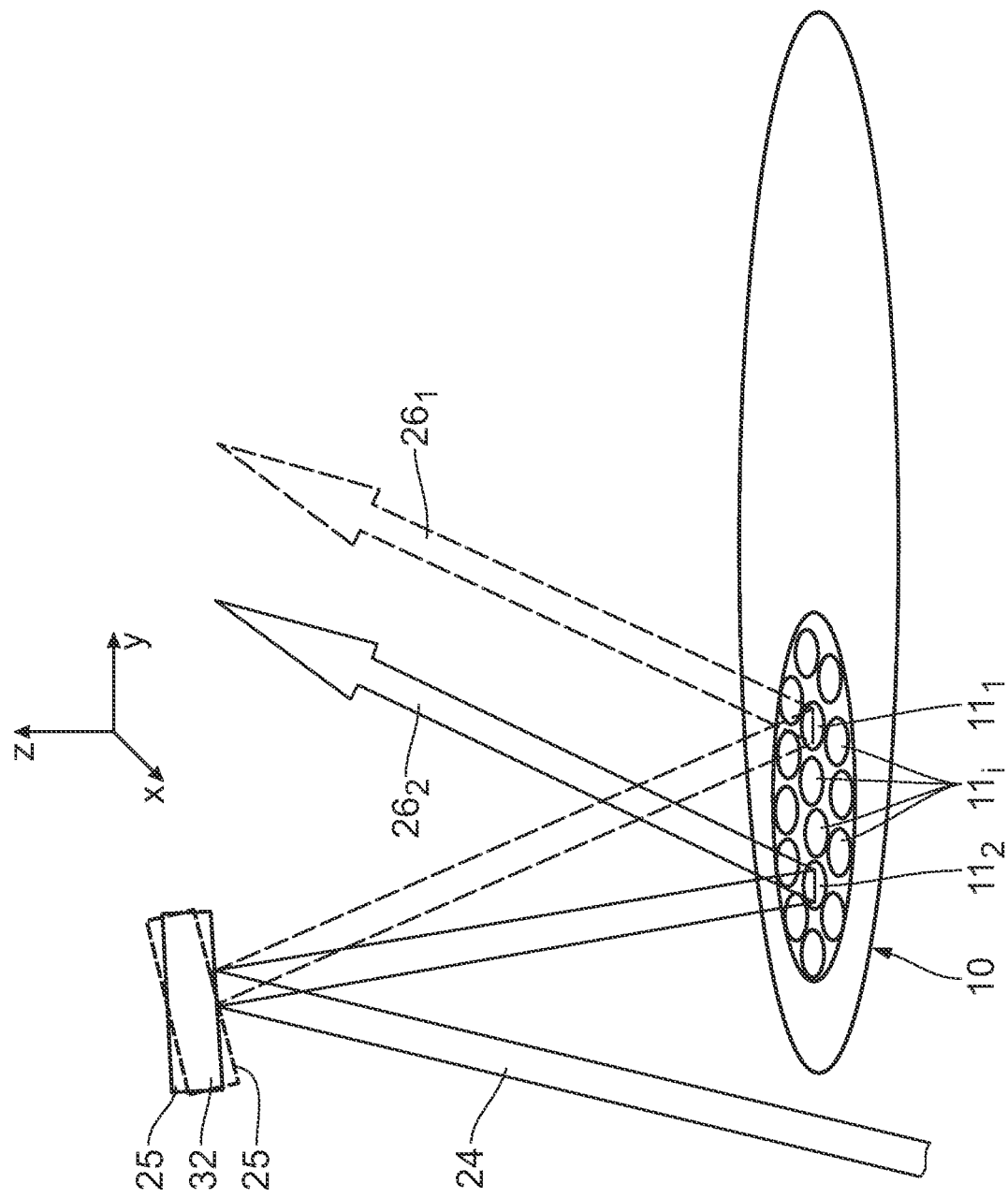
FIG. 5 schematically shows portions of two object field illumination channels, which are assigned to two illumination tilt positions of a shown tiltable field facet of the field facet mirror according to FIG. 2 or 4, an incident illumination light part bundle in the two illumination tilt positions.

FIG. 5 illustrates the reflected guidance of a part bundle 24 of a total bundle of the illumination light 3. A reflection face 25 of a field facet 7 shown by way of example is tiltable between a first illumination tilting position to guide the part bundle 24, which impinges on the reflection face 25, along a first object field illumination channel $26_1$ (dashed lines) to the object field 18 or to the illumination field, and a further illumination tilt position to guide the part bundle 24 along a further object field illumination channel $26_2$ (solid lines) to the object field 18.

Along the first illumination channel $26_1$, the part bundle 24, after reflection on the field facet 7, is reflected on a first pupil facet $11_1$. The pupil facet $11_1$ is thus assigned to the field facet 7 by way of the object field illumination channel $26_1$. Along the object field illumination channel $26_2$, in other words in the other illumination tilt position of the field facet 7, the part bundle 24, after reflection on the field facet 7, is reflected on another pupil facet $11_2$ of the pupil facet mirror 10. Only some of the pupil facets 11 of the pupil facet mirror 10 are shown in FIG. 5, namely those pupil facets which are located adjacent to pupil facets $11_1$, $11_2$.

Figure 6:
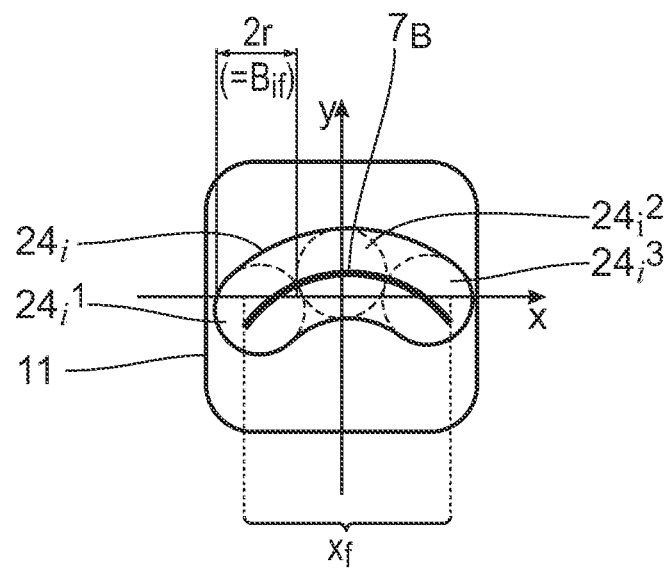
FIG. 6 shows an embodiment of a pupil facet which may be used alternative to the pupil facet mirror according to FIG. 3, wherein an edge or marginal contour of an illumination light part bundle is shown on the pupil facet, the pupil facet being impinged via exactly one of the field facets of a field facet mirror according to FIG. 4, wherein the pupil facet is arranged in the vicinity of but still at a distance to the image of the light source.

FIG. 6 shows one of the pupil facets 11 that can be used in the pupil facet mirror 10. The pupil facet 11 according to FIG. 6 does not have a circular edge or marginal contour, as presented in FIG. 3 or 5, but instead an almost square edge or marginal contour with rounded-off corners. Such an edge or marginal contour, which may also be designed without rounded-off corners, i.e. in a square or rectangular manner, allows the pupil facet carrier to be occupied relatively densely with the pupil facets 11.

The pupil facet 11 according to FIG. 6 is impinged upon with the illumination light part bundle $24_i$ from an arcuate field facet 7 of the field facet mirror 6 according to FIG. 4.

FIG. 6 shows a location of the illumination light part bundle $24_i$ that is reflected by the pupil facet 11. An entire cross section of the illumination light part bundle $24_i$ lies on the pupil facet 11, and so the edge or margin of the illumination light part bundle $24_i$ is not cut off or trimmed by the edge or margin of the pupil facet 11. An edge or marginal contour of the cross section of the illumination light part bundle $24_i$ on the pupil facet 11 has an approximately arcuate, bean-shaped or kidney-shaped form and can be understood to be the convolution of an image of the arcuate field facets 7 (cf. solid line "$7_B$" in FIG. 6) according to FIG. 4 with a round source area of the light source 2. This convolution arises on account of the fact that an image of the light source 2 arises at an image location which lies along the illumination channel $24_i$ at a distance from the pupil facet 11, i.e. up-stream or downstream of the pupil facet 11 in the beam path.

The arcuate edge or marginal contour of the illumination light part bundle $24_i$ on the pupil facet 11 represents a light spot of the illumination light part bundle $24_i$.

Three sub-beams $24_i^1$, $24_i^2$ and $24_i^3$ of the illumination light part bundle $24_i$ are plotted using dashed lines in the edge or marginal contour of the illumination light part bundle $24_i$ on the pupil facet 11. The illumination light part bundle $24_i$ is composed of a multiplicity of such sub-beams $24_i^j$. To the extent that the optical parameters of the illumination are known, the illumination light part bundle $24_i$ can be calculated, for example with the aid of an optical design program.

The illumination light 3 of these sub-beams $24_i^1$ to $24_i^3$ proceeds from a left edge or marginal point $7^1$, from a central point $7^2$ and from a right edge or marginal point $7^3$ of the associated field facet 7. In FIG. 4, these initial points $7^1$ to $7^3$ are plotted in an exemplary manner on one of the field facets 7.

The intensity of the marginal sub-beams $24_i^1$ and $24_i^3$ is smaller than the intensity of the central sub-beam $24_i^2$.

Figure 7:
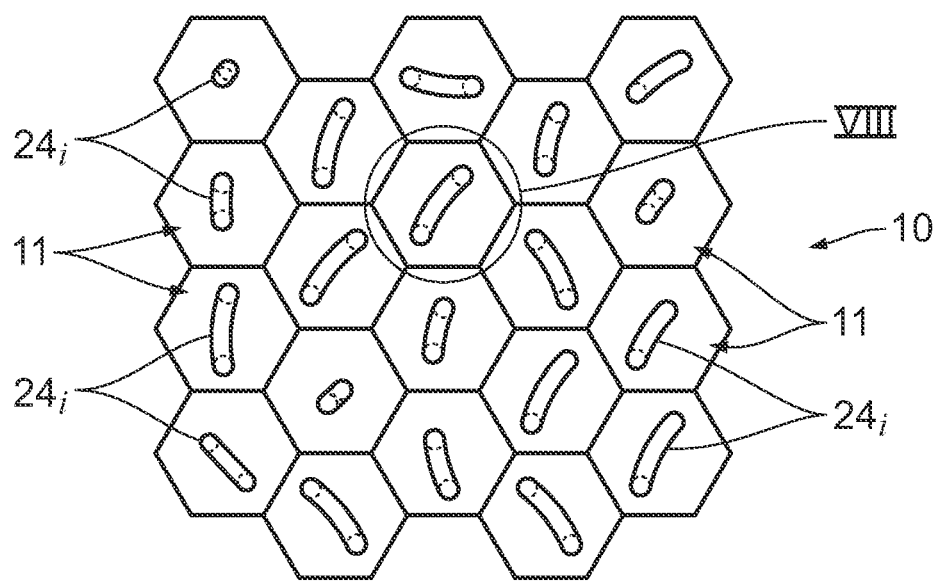
FIG. 7 shows a section of another embodiment of a pupil facet mirror including more than a dozen pupil facets each of them showing a marginal contour of an illumination light part bundle, wherein most of the shown pupil facets are arranged in the vicinity of but still at a distance to the image of the light source.

FIG. 7 shows a section of another embodiment of a pupil facet mirror 10 which can be used in the illumination optical system 23 instead of the pupil facet mirrors 10 described above. Components and functions which are described above with reference to FIGS. 1 to 6 carry the same reference numerals and are not again described in detail.

The pupil facet 11 in the FIG. 7 embodiment have a hexagonal outer contour and are shown in a dense packaging. Shown on the respective pupil facet 11 is the illumination light part bundle $24_i$ of the corresponding illumination channel 26. Depending on the spatial relationship between the field facet 7 and the pupil facet 11 which belong to each of the respective illumination channels and depending on the distance of the respective pupil facet to the image of the light source, the illumination light part bundles $24_i$ have different orientations and extensions on their assigned pupil facet 11. For pupil facets 11 which are located closely to the image of the light source, the illumination light part bundle $24_i$ more or less has the shape of a dot and represents the image of the light source 2. For pupil facets 11 having a larger distance to the image of the light source, the extension of the corresponding illumination light part bundle $24_i$ impinging on this pupil facet 11 is larger and the marginal contour of such illumination light bundle 24 can be recognized as a convolution of the light source image with the shape of the corresponding field facets 7, i.e. shows an arcuate shape.

Figure 8:
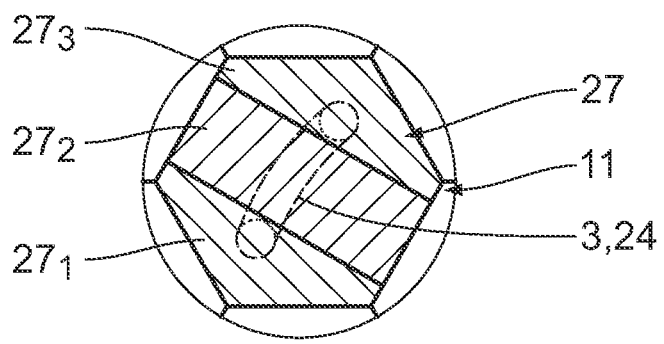
FIG. 8 shows one of the pupil facets according to detail VIII in FIG. 7 being embodied as a selectively reflecting pupil facet and having three coating areas with two different reflectivities.

FIG. 8 shows one of the pupil facets 11 enlarged and more in detail. Such pupil facets 11 according to FIG. 8 is designed as a selectively reflecting pupil facet 11. A reflective coating 27 for the illumination light 3, i.e. for the illumination light part bundle $24_i$, has a first coating area $27_1$ on a first part of the pupil facet 11, a second coating area $27_2$ on a second part of the pupil facet 11 and a third coating area $27_3$ on a third part of the pupil facet 11. The first coating area $27_1$ and the third coating area $27_3$ both have a first, higher reflectivity $R_{1/3}$ for the illumination light 3. The second coating area $27_2$ has a second, lower reflectivity $R_2$ compared to the first reflectivity.

The reflectivity ratio $R_{1/3}/R_2$ of the reflectivities of these coating areas $27_1$, $27_3$ on the one hand and $27_2$ on the other has at least approximately the inverse value of the intensity ratio $I_{1/3}/I_2$ of the marginal sub-beams $24_i^1$, $24_i^3$ on the one hand and the central sub-beam $24_i^2$ on the respective coating areas $27_1$, $27_3$ and $27_2$.

Such ratio values lead to a homogenization of the intensity of the illumination light 3 seen over the whole area of the illumination light part bundle $24_i$. By dividing the reflective coating 27 into multiple coating areas having respectively adapted reflectivities, it is possible to homogenize/compensate an intensity variation throughout the illumination light part bundle $24_i$. This can be used as a uniformity correction mechanism to ensure a given intensity homogeneity over the x direction of the object field 18, i.e. to ensure illumination uniformity over the field height x.

Some or all pupil facets 11 of the pupil facet mirror 10 of FIG. 7 can be embodied as selectively reflecting pupil facets 11 as described above.

The arrangement of the different coating areas $27_i$ on each of the pupil facets 11 depends on the location, orientation and extension of the respective illumination light part bundle $24_i$ impinging on such pupil facets 11. Such variable arrangement of the coating areas $27_i$ may be realized by different orientations of the boundaries between such coating areas $27_i$ and/or may be realized by different extensions and/or by different numbers of such coating areas $27_i$. In addition, depending on the respective selectively reflecting pupil facet embodiment, the reflectivities of two adjacent of the different coating areas $27_i$, i.e. the reflectivities of coating areas $27_1$ and $27_2$ or the reflectivities of coating areas $27_2$ and $27_3$ of the embodiment according to FIG. 8 may merge continuously into each other to fit the reflectivity dependence of the reflective coating 27 as a whole to the intensity dependence over the illumination light part bundle $24_i$.

Figure 9:
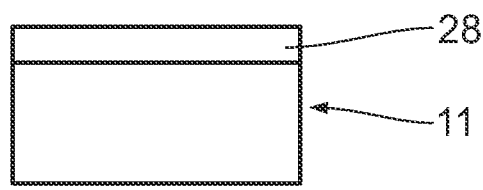
FIG. 9 shows a schematic side view of another embodiment of a pupil facet being embodied as a broadband reflecting pupil facet having a broadband reflective coating for the illumination light.

FIG. 9 shows in a side view another embodiment of a pupil facet 11. The pupil facet 11 of FIG. 9 is designed as a broadband reflecting pupil facet. Such pupil facet 11 according to FIG. 9 can be used for some or all of the pupil facets of one of the embodiments of pupil facet mirrors 10 described above.

The broadband pupil facet 11 according to FIG. 9 has a broadband reflective coating 28 which is carried by a main body of the broadband reflective pupil facet 11.

The broadband reflective coating 28 may be embodied as a multilayer coating, in other words a multilayer coating with an alternating aperiodic sequence of molybdenum and silicon layers.

Instead of the multilayer reflection coating, a single layer or a double layer reflection coating with a very narrow angle of incidence tolerance range may also be used. When using multilayer reflection coatings with aperiodic layer stacks, in other words so-called broadband coatings, the angle of incidence tolerance range is increased.

During the projection exposure, the reticle 17 and the wafer 22, which carries a light-sensitive coating for the EUV illumination light 3, are provided. At least one portion of the reticle 17 is then projected on the wafer 22 with the aid of the projection exposure system 1. Finally, the light-sensitive layer exposed with the EUV illumination light 3 is developed on the wafer 22. The microstructured or nanostructured component, for example a semiconductor chip, is produced in this manner.

The embodiments described above were described with the aid of an EUV illumination. As an alternative to an EUV illumination, a UV or a VUV illumination can also be used, for example with illumination light with a wavelength of 193 nm.

What is claimed is:

1. An optical system configured to illuminate an illumination field, the optical system comprising:
   a pupil facet mirror comprising a plurality of pupil facets, wherein:
      each pupil facet is configured to guide an illumination light part bundle;
      for each of at least some of the pupil facets, the pupil facet comprises a coating that is reflective for the illumination light;
      the coating comprises a first volume and a second volume horizontally displaced from the first volume;
      the first volume of the coating has a first reflectivity for the illumination light;
      the second volume of the coating has a second reflectivity for the illumination light;
      the first reflectivity for the illumination light is different from the second reflectivity for the illumination light; and
      the optical system is a projection lithography illumination optical system.

2. The optical system of claim 1, wherein:
   for each of at least some of the pupil facets, the coating comprises a third volume having a third reflectivity;
   the third volume is horizontally displaced from the both the first and second volumes; and
   the third reflectivity is different from the second reflectivity.

3. The optical system of claim 2, wherein the third reflectively is the same as the first reflectively.

4. The optical system of claim 3, wherein the first and second reflectivities merge continuously into each other, and the second and third reflectivities merge continuously into each other.

5. The optical system of claim 1, wherein the first and second reflectivities merge continuously into each other.

6. The optical system of claim 1, wherein the pupil facets of the pupil facet mirror are configured so that an image of the light source arises at an image location which lies at a distance from the pupil facet along an illumination channel of the illumination light.

7. The optical system of claim 1, further comprising a field facet mirror comprising field facets configured to be superimposingly imaged under contribution of the pupil facets of the pupil facet mirror onto the illumination field.

8. An illumination system, comprising:
   an optical system according to claim 1; and
   an imaging optical system configured to image an object field into an image field.

9. A projection exposure system, comprising:
   an illumination system, comprising:
      an illumination optical system according to claim 1; and
      an imaging optical system configured to image an object field into an image field; and
   an illumination light source.

10. A method of using a projection exposure system comprising an illumination optical system and an imaging optical system, the method comprising:
    using the illumination optical system to illuminate a region of a reticle in an object field of the imaging optical system; and
    using the imaging optical to project at least a part of the illuminated reticle onto a region of a light-sensitive material in an object field of the imaging optical system,
    wherein the illumination system comprises an illumination optical system according to claim 1.

11. The optical system of claim 1, further comprising a body supporting the pupil facets, wherein, for each of at least some of the pupil facets comprising first and second volumes:
    the first volume extends from a first surface of the pupil facet which contacts the body to an opposite surface of the pupil facet which is an outermost surface of the pupil facet; and
    the second volume extends from the first surface of the pupil facet to the opposite surface of the pupil facet.

12. The optical system of claim 1, wherein the illumination light is in the EUV range.

13. The optical system of claim 1, wherein the pupil facet mirror comprises further pupil facets which comprise a broadband reflective coating for the illumination light.

14. The optical system of claim 1, wherein the second volume is between the first and third volumes.

15. An optical system configured to illuminate an illumination field, the optical system comprising:
    a pupil facet mirror comprising a plurality of pupil facets, wherein:
       each pupil facet is configured to guide an illumination light part bundle;
       for each of at least some of the pupil facets, the pupil facet comprises a broadband reflecting pupil facet comprising a coating that is broadband reflective for the illumination light;
       the pupil facets of the pupil facet mirror are configured so that an image of the light source arises at an image location which lies at a distance from the pupil facet along an illumination channel of the illumination light; and
       the optical system is a projection lithography illumination optical system.

16. The optical system of claim 15, further comprising a field facet mirror comprising field facets configured to be superimposingly imaged under contribution of the pupil facets of the pupil facet mirror onto the illumination field.

17. The optical system of claim 15, wherein the illumination light is in the EUV range.

18. An illumination system, comprising:
    an optical system according to claim 15; and
    an imaging optical system configured to image an object field into an image field.

19. A projection exposure system, comprising:
    an illumination system, comprising:

an illumination optical system according to claim 15; and an imaging optical system configured to image an object field into an image field; and an illumination light source.

20. A method of using a projection exposure system comprising an illumination optical system and an imaging optical system, the method comprising:

using the illumination optical system to illuminate a region of a reticle in an object field of the imaging optical system; and using the imaging optical to project at least a part of the illuminated reticle onto a region of a light-sensitive material in an object field of the imaging optical system wherein the illumination system comprises an illumination optical system according to claim 15.

* * * * *

UNITED STATES PATENT AND TRADEMARK OFFICE
CERTIFICATE OF CORRECTION

| | | |
|---|---|---|
| PATENT NO. | : 11,327,403 B2 | Page 1 of 1 |
| APPLICATION NO. | : 17/317112 | |
| DATED | : May 10, 2022 | |
| INVENTOR(S) | : Tian Gang et al. | |

It is certified that error appears in the above-identified patent and that said Letters Patent is hereby corrected as shown below:

In the Specification

Column 5, Line 45, delete "(cf" insert -- (cf. --.

Column 6, Line 63, delete "facets" insert -- facets $11_1$ --.

Signed and Sealed this
Sixteenth Day of August, 2022

*Katherine Kelly Vidal*

Katherine Kelly Vidal
*Director of the United States Patent and Trademark Office*